(12) United States Patent
Jordan

(10) Patent No.: US 8,074,342 B1
(45) Date of Patent: Dec. 13, 2011

(54) RADIO CONNECTION METHOD

(76) Inventor: William F. Jordan, Tallahassee, FL (US)

(*) Notice: Subject to any disclaimer, the term of this patent is extended or adjusted under 35 U.S.C. 154(b) by 0 days.

(21) Appl. No.: 12/943,374

(22) Filed: Nov. 10, 2010

(51) Int. Cl.
*H04R 31/00* (2006.01)
(52) U.S. Cl. .............................. 29/594; 29/592.1; 29/825
(58) Field of Classification Search ................. 29/592.1, 29/594, 825
See application file for complete search history.

(56) References Cited

FOREIGN PATENT DOCUMENTS
KR        2008089139        * 12/2007
* cited by examiner

*Primary Examiner* — Carl Arbes
(74) *Attorney, Agent, or Firm* — J. Wiley Horton

(57) ABSTRACT

A method for using a standard cable to replace the proprietary cables currently used to connect radio components. The invention also includes the hardware provided to carry out the method. A pair of jumper boxes are provided. Each jumper box contains a control jack, a microphone jack, an audio jack, and a VGA jack. The control and microphone jacks are not directly connected to the VGA jack. Instead, the control and microphone jacks are connected to certain pins within a jumper pin array. The VGA jack is connected to other pins within the same jumper pin array. The user can place jumpers within the jumper pin array to connect selected pins within the control and microphone jacks to selected pins within the VGA jack. The two jumper boxes are connected using the VGA cable. One jumper box is connected to the radio, and the other jumper box is then connected to the remote components.

20 Claims, 10 Drawing Sheets

RADIO CONNECTION METHOD

BACKGROUND OF THE INVENTION

1. Field of the Invention

This invention relates to the field of communications. More specifically, the invention comprises a method for using an inexpensive VGA cable to connect a variety of different radio devices, along with the hardware used to carry out the method.

2. Description of the Related Art

The present invention has application to a wide variety of communication equipment. However, is it particularly suited to the field of amateur radio. FIG. 1 shows the major components of an amateur radio (excluding the antenna assembly). Radio 10 contains most of the electronics, including the transmitter and receiver. The user controls were traditionally mounted on the same housing. However—in recent years—many units feature a separate control panel which may be mounted on the housing or mounted separately. This separate panel is known as a "control head."

FIG. 1 shows such a configuration. Control head 12 is separate from radio 10. The control head contains knobs, message displays, input keys, etc. In most units, it contains all the elements a user needs to control the functions of the radio. Thus, the control head and the radio must be connected via a communication cable. Control cable 18 serves this purpose. The illustration shows a typical control cable. Amateur radio manufactures generally use one or more "registered jacks" to connect transmitter/receiver ("transceiver") units to microphones and remotely located controls. The term "registered jack" ("RJ") is a consequence of Bell System's requirement to offer competitors access to telephone systems in offices and homes. RJ standard jacks provide a method of interconnecting data or telecommunications devices to service providers. Although technically "RJ" refers to jacks, the term applies currently to both plugs and jacks.

Initially, RJ modular connections were named RJ11, RJ12, RJ21, RJ41, etc. However, they differed only in the number of positions and conductors. The RJ12 jack has six positions and six conductors and is often identified as "6P6C." The RJ11, which is physically identical to the RJ12, has only four conductors and is identified as 6P4C. Jacks are downward compatible with plugs having fewer positions. Thus, a 6P6C jack physically accommodates 4P4C plugs. However, only the inner 4 conductors of a 6P6C jack are connected to the 4P4C conductors. Similarly, an 8P8C jack accommodates 6P and 4P plugs. Because plugs with fewer positions fit into 8P8C jacks, an RJ jack with eight positions and eight conductors is ideal for interconnecting amateur radio devices that use 4P4C, 6P6C, and 8P8C plugs and jacks.

The de facto standard 8P8C jack is usually referred to as an RJ45, and that is the term this document will use to identify jacks 48 and 50 in FIG. 4. Thus, hereinafter, "RJ45" is defined as an 8P8C registered jack that accommodates registered jacks with fewer positions and/or conductors. Most amateur radio transceivers utilize RJ45 jacks, as defined in this paragraph, to connect microphones and control heads to transceivers.

First female RJ45 jack 24 is provided on radio 10 in FIG. 1. This receives the first male RJ45 plug 32 on control cable 18. The opposite end of control cable 18 terminates in second male RJ45 plug 34. This plugs into second female RJ45 jack 30 on control head 12. Thus, the user may locate control head 12 remotely from radio 10 by linking the two components with control cable 18.

There is no standard in the amateur radio industry for the function or even the number of conductors used in cable 18. Each manufacturer wires its cables independently of other manufacturers and, in fact, varies the wiring of connecting cables within its own product lines. Thus—referring back to FIG. 1—a control cable 18 furnished by one manufacturer to connect its control head to its radio will likely not work for a second manufacturer's radio or even a different radio in its own product line. Manufacturers will use the available pins on the RJ45 for different purposes, and to connect one radio's cables to another radio is not only likely to fail, but may seriously damage the radio.

Microphone cable 20 is likewise not standardized within the industry. It is connected to radio 10 by plugging third male RJ45 plug 36 into third female RJ45 jack 26 on radio 10. This allows microphone 14 to be located a desired distance away from radio 10. However, a microphone cable 20 from one manufacturer will likely not function with components furnished from a different manufacturer.

An example of the lack of standardization is provided by considering the pinouts the microphone RJ45 jacks of two specific radios offered by two prominent manufacturers within the industry—Yaesu and Kenwood. For the Yaesu and Kenwood models, the pin functions are as follows:

| Pin Number | Yaesu | Kenwood |
| --- | --- | --- |
| 1 | GND | NONE |
| 2 | FAST | +8 VDC |
| 3 | PTT | GND |
| 4 | MIC | PTT |
| 5 | MIC GND | MIC GND |
| 6 | +5 V | MIC 600 Ω |
| 7 | UP | NONE |
| 8 | DOWN | SERIAL DATA |

From these two examples, one may easily perceive how using one manufacturer's cable on another manufacturer's product could cause many problems, including, in this case, destroying both microphones by applying voltages incorrectly.

The only standardized connection typically involves speaker 16, which is connected to radio 10 using speaker cable 22. The speaker cable 22 is connected by plugging male audio plug 38 into female audio jack 28.

The arrangement shown in FIG. 1 is now common for mobile amateur radio stations. The bulkiest item is radio 10, which requires connections for both high-current voltage and an antenna. Therefore, it is desirable to locate it remotely while keeping the components with which the user interacts (microphone 14, control head 12, and speaker 16) close by. Radio manufacturers provide kits for this purpose. Each kit would typically contain a control cable 18, microphone cable 20, and speaker cable 22.

FIG. 2 shows how such a remote location kit would be used to install an amateur radio in a car 40. Radio 10 is mounted in trunk 42, where its bulk does not present a problem. Control head 12, microphone 14, and speaker 16 are mounted near the vehicle's dash in a position that is convenient for the driver. These three components are then independently connected to radio 10 using control cable 18, microphone cable 20, and speaker cable 22.

Since the three cables needed are proprietary items sold by each manufacturer, they are often relatively expensive. In addition, if the user changes to another type of radio, at least the microphone cable and control cable must be removed and replaced with different types. It would be preferable to provide a system for standardizing the cables used for remotely locating a radio. The present invention provides just such a solution.

BRIEF SUMMARY OF THE INVENTION

The present invention comprises a method for using a standard cable to replace the proprietary cables currently used to connect radio components. The invention also includes the hardware provided to carry out the method. A pair of jumper boxes are provided. Each jumper box contains a control jack, a microphone jack, an audio jack, and a VGA jack. The control and microphone jacks are not directly connected to the VGA jack. Instead, the control and microphone jacks are connected to certain pins within a jumper pin array. The VGA jack is connected to other pins within the same jumper pin array. The user can place jumpers within the jumper pin array to connect selected pins within the control and microphone jacks to selected pins within the VGA jack.

The microphone, speaker, and control head are connected to the first of the pair of jumper boxes using standard non-proprietary cables. A conventional VGA cable is used to connect the first jumper box to the second jumper box. The second jumper box is then connected to the radio using standard non-proprietary cables (with appropriate jumper placements being made in the jumper array within the second jumper box as well). The use of the selectively placed jumpers in the first and second jumper boxes allows the user to adapt the hardware to a wide variety of proprietary radio connection schemes, with the distance between the two jumper boxes being spanned by a widely available and inexpensive VGA cable.

Figure 1:
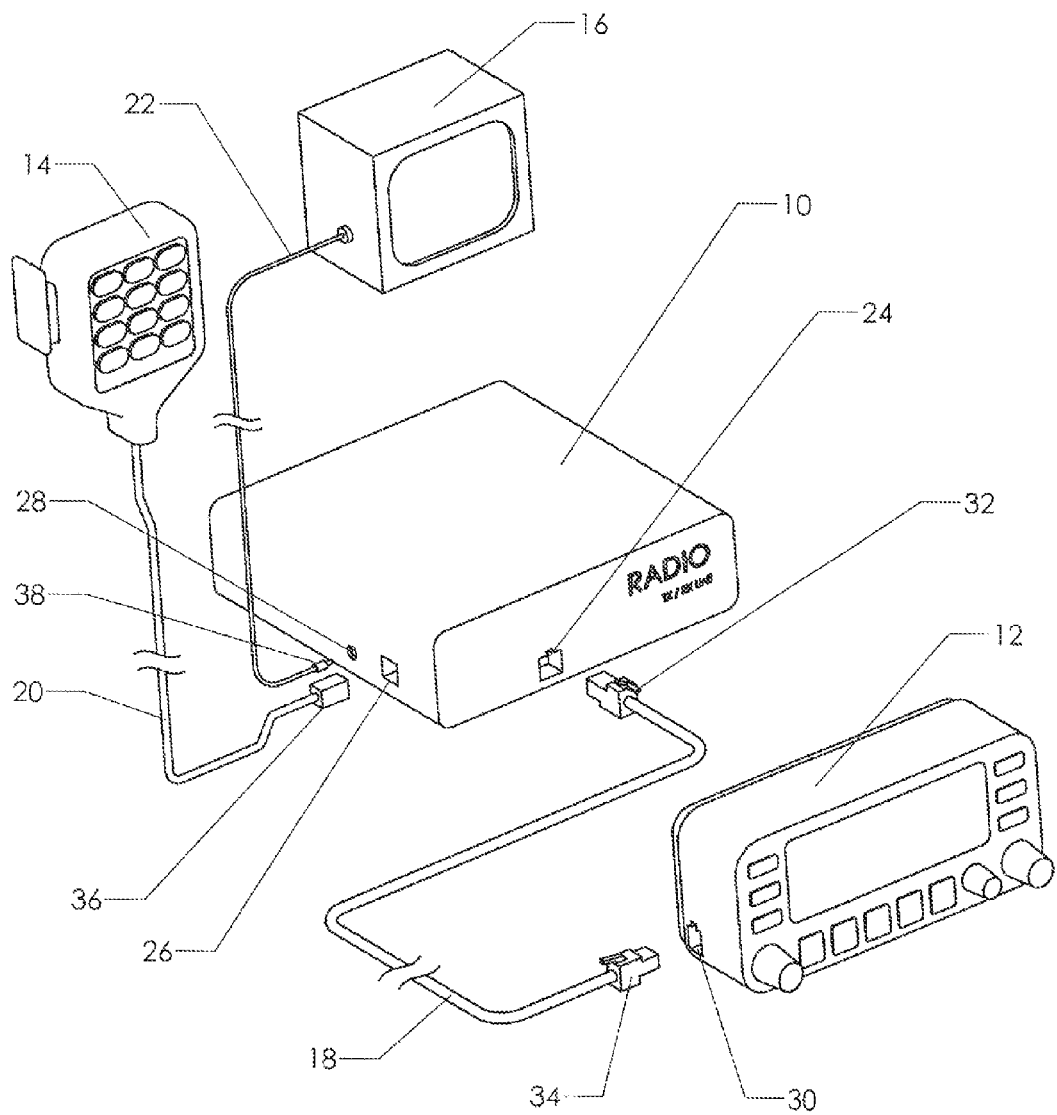
FIG. 1 is a perspective view, showing the components of a radio with a separable control head.

| REFERENCE NUMERALS IN THE DRAWINGS | | | |
|---|---|---|---|
| 10 | radio | 12 | control head |
| 14 | microphone | 16 | speaker |

-continued

| REFERENCE NUMERALS IN THE DRAWINGS | | | |
|---|---|---|---|
| 18 | control cable | 20 | microphone cable |
| 22 | speaker cable | 24 | first female RJ45 jack |
| 26 | third female RJ45 jack | 28 | female audio jack |
| 30 | second female RJ45 jack | 32 | first male RJ45 plug |
| 34 | second male RJ45 plug | 36 | third male RJ45 jack |
| 38 | male audio jack | 40 | car |
| 42 | trunk | 44 | VGA cable |
| 46 | jumper box | 48 | microphone jack |
| 50 | control jack | 52 | audio jack connection |
| 54 | VGA jack | 56 | PC board |
| 58 | jumper pin | 60 | PCB trace |
| 62 | jumper pin array | 64 | jumper |

DETAILED DESCRIPTION OF THE INVENTION

Figure 2:
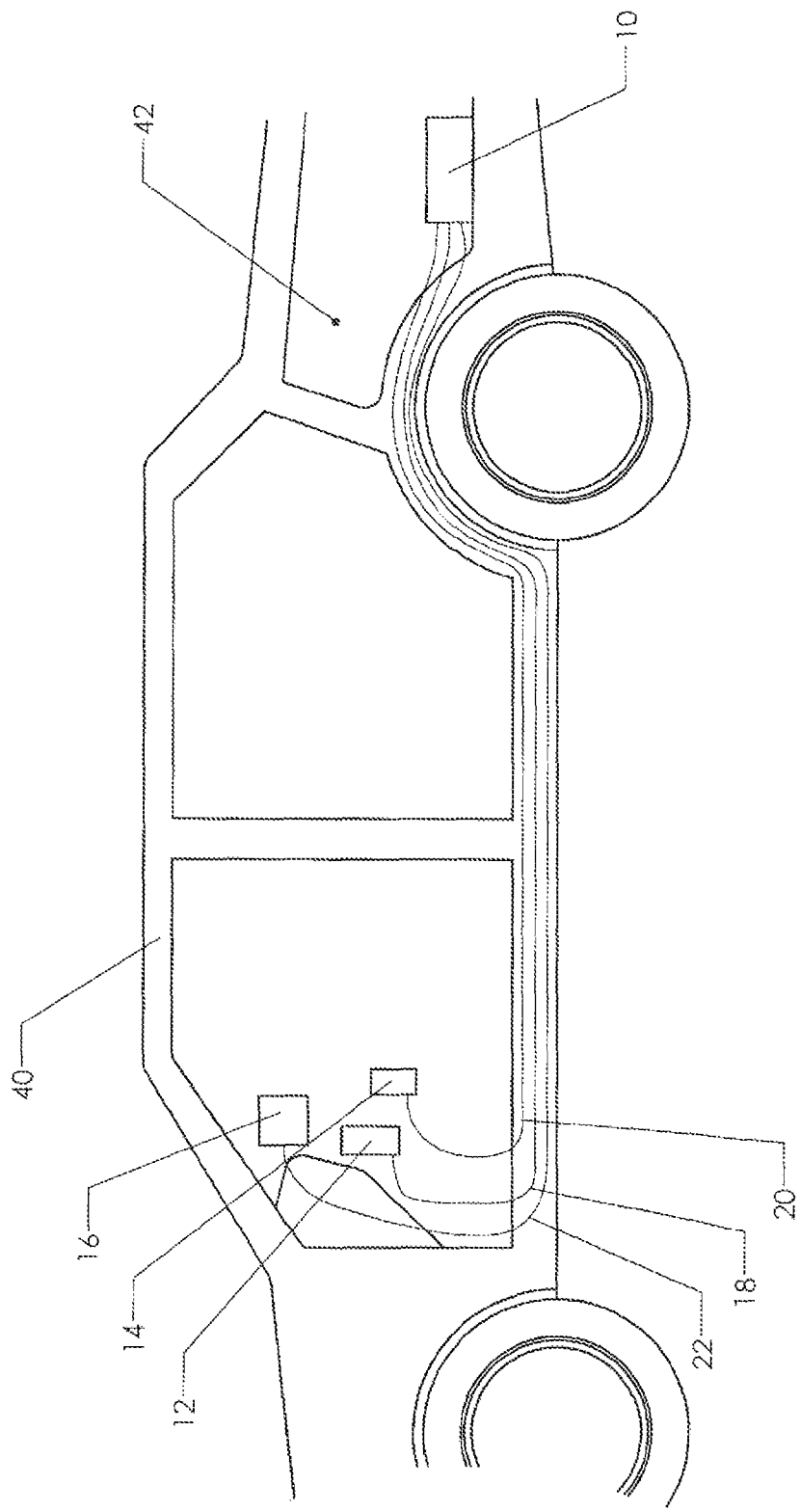
FIG. 2 is an elevation view, showing the mounting of a radio with remote components in a car using a manufacturer's separate, proprietary cables.

Manufacturers of most current radios provide a remote installation kit that includes the three separate cables shown in FIG. 2. Nearly all the manufacturers use RJ45 jacks. However, as mentioned previously, there is no standard way of configuring the use of the eight conductive pins in the RJ45 jacks and the connecting cables. Thus, one manufacturer's cable kit will generally not work with a radio from another manufacturer. The present invention allows the use of a standard VGA cable to link the various radio components.

VGA cables contain 15 conductors as well as a grounded shield or plug shell and are widely available. Since they are offered by many manufacturers, they are competitively priced. High-quality VGA cables use ferrite chokes on each end and are well shielded. Thus, although they were originally developed by IBM to connect computers to monitors, they also work well for this radio application.

Figure 3:
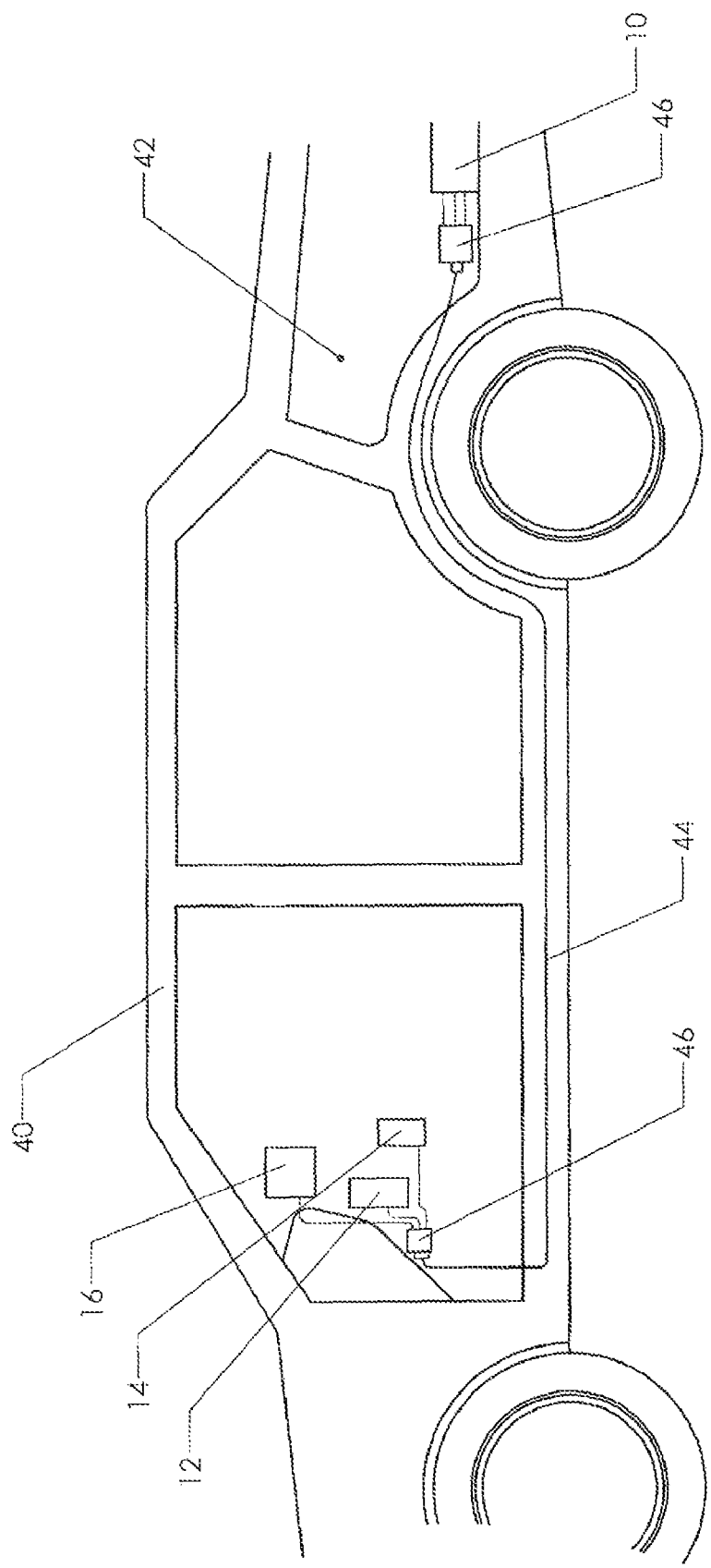
FIG. 3 is an elevation view, showing the mounting of a radio with remote components in a car using the present invention.

FIG. 3 schematically depicts how the present invention is connected to the radio components. Two jumper boxes 46 are provided. One of these jumper boxes is placed near radio 10 in the trunk of the car. The second jumper box 46 is placed near the remote components that need to be linked to the radio—in this case control head 12, microphone 14, and speaker 16.

Short conventional cables are used to link the components to the jumper boxes. These will typically be standard 8 conductor cables with a male RJ45 plug on either end. Three such short cables are used to link the jumper box 46 in the car's trunk to radio 10. One such cable connects to the radio's control jack (such as first female RJ45 jack 24 in FIG. 1). One such cable connects to the radio's microphone jack (such as third female RJ45 jack 26 in FIG. 1). The third such cable connects to the radio's audio jack (such as female audio jack 28 in FIG. 1). Thus, a manufacturer's separate cables may contain as many as 18 conductors, some of which are redundant. By combining redundant connections—at least the three separate ground conductors, for example—the total connections will be reduced by jumper configurations in box 46 to no more than the 15 conductors and common ground of a VGA cable.

Jumper box 46, located near the vehicle's dash, separates the VGA cable's conductors, including the combined redundant conductors, and distributes them to the microphone, control head, and audio jacks in the precise configuration present at radio 10. Two short cables are also used to link the speaker and control head to the jumper box 46. One such cable connects to the control head's control jack (such as second female RJ45 jack 30 in FIG. 1). The microphone plug 36 in FIG. 1 is directly connected to RJ45 jack 50 in FIG. 4.

Figure 4:
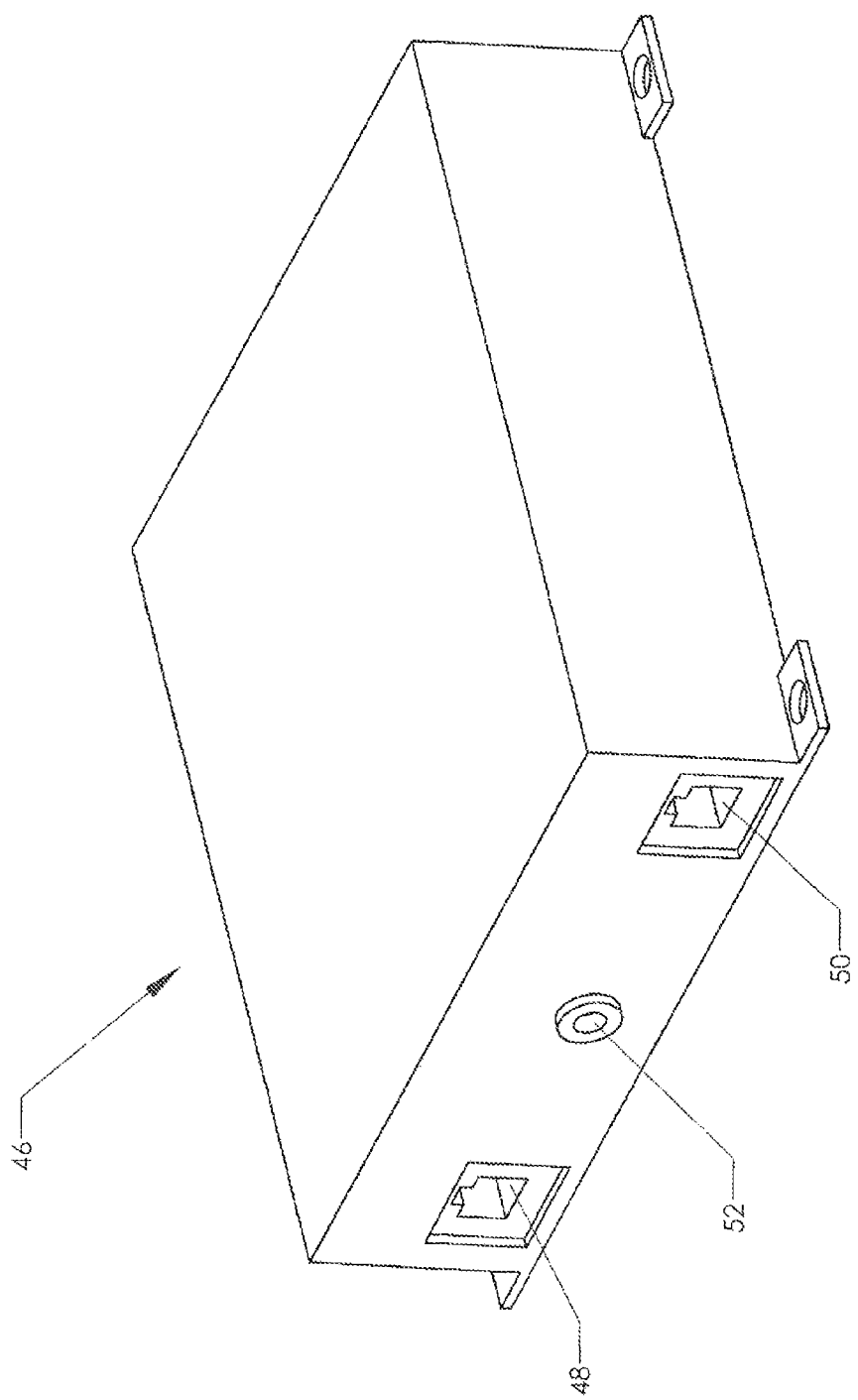
FIG. 4 is a perspective view, showing a jumper box as used in the present invention.

Finally, a speaker connector (such as male audio plug 38 in FIG. 1) is preferably also plugged into audio jack 52 in FIG. 4 of jumper box 46.

The inexpensive VGA cable 44 is the only cable that needs to be run through the car to the trunk- and—this component can remain in place regardless of future radio substitutions. If the operator buys a new radio, he can reconfigure the two jumper boxes to accommodate the different wiring in the new radio. If the operator sells the car and removes the radio, he may simply elect to leave the inexpensive VGA cable in place and elect to run a new one in a replacement vehicle. The reconfigurability of the jumper boxes allows the same hardware to be used for many different types of radios, which is an important advantage of the present invention.

As will now be explained, the use of the jumper boxes is the key to the reconfigurability. FIG. 4 shows an embodiment of jumper box 46. It is preferably a compact object containing external jacks and internal connections. It is preferably a passive device so that it will need no internal or external power. Microphone jack 48 and control jack 50 are provided on an exterior surface. In this case, the microphone and control jacks are of the female RJ45 type. It is also desirable to provide an audio jack 52.

The enclosure is represented as a folded sheet metal design—which is suitable for small production quantities. The lid of the enclosure can be hinged or made otherwise removable so that the user may easily access the interior. Of course, those skilled in the art will know that the enclosure could be made of injection molded plastic or other suitable materials.

Figure 5:
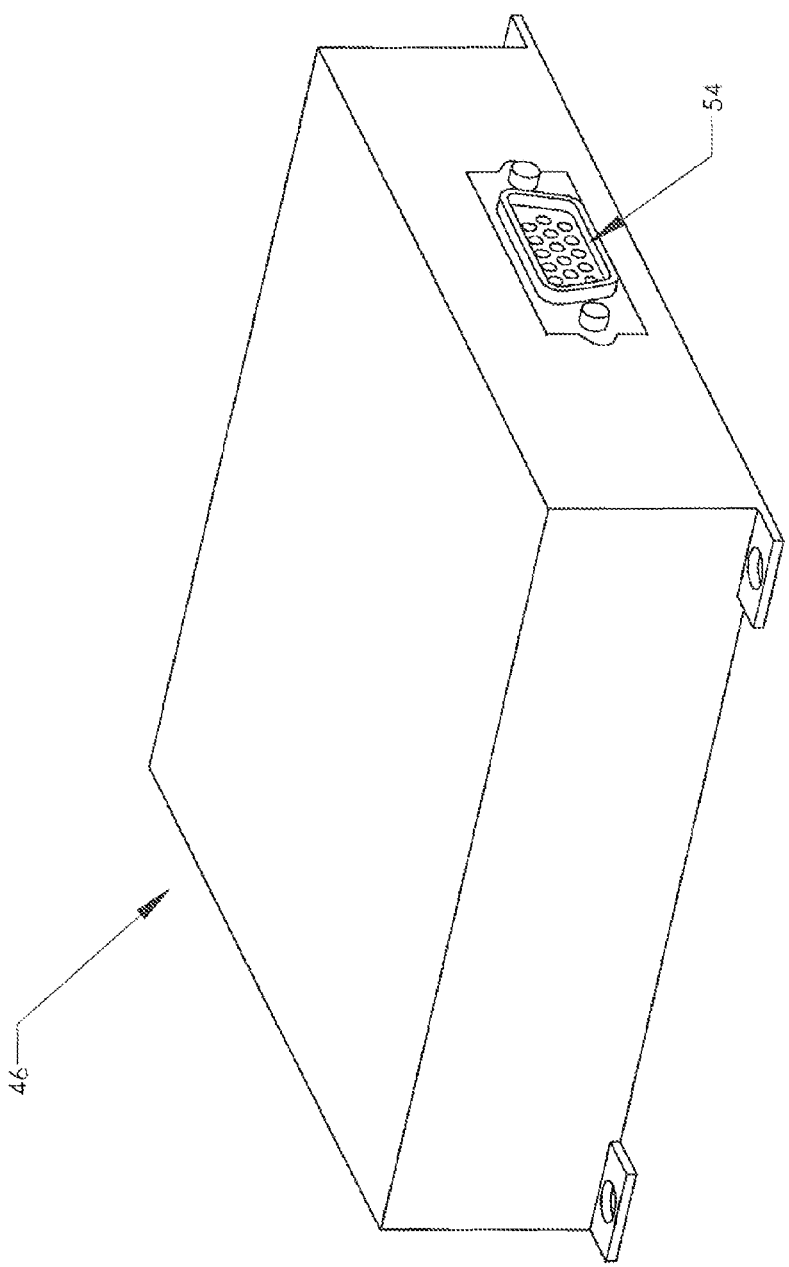
FIG. 5 is a perspective view, showing the jumper box of FIG. 4 from the opposite side.

FIG. 5 shows the opposite side of jumper box 46. VGA jack 54 is located on this surface. The location of the various jacks is purely a design choice and the jacks may be rearranged or grouped differently in other embodiments. Mounting tabs or other features are preferably provided to facilitate the mounting of the jumper box.

Figure 6:
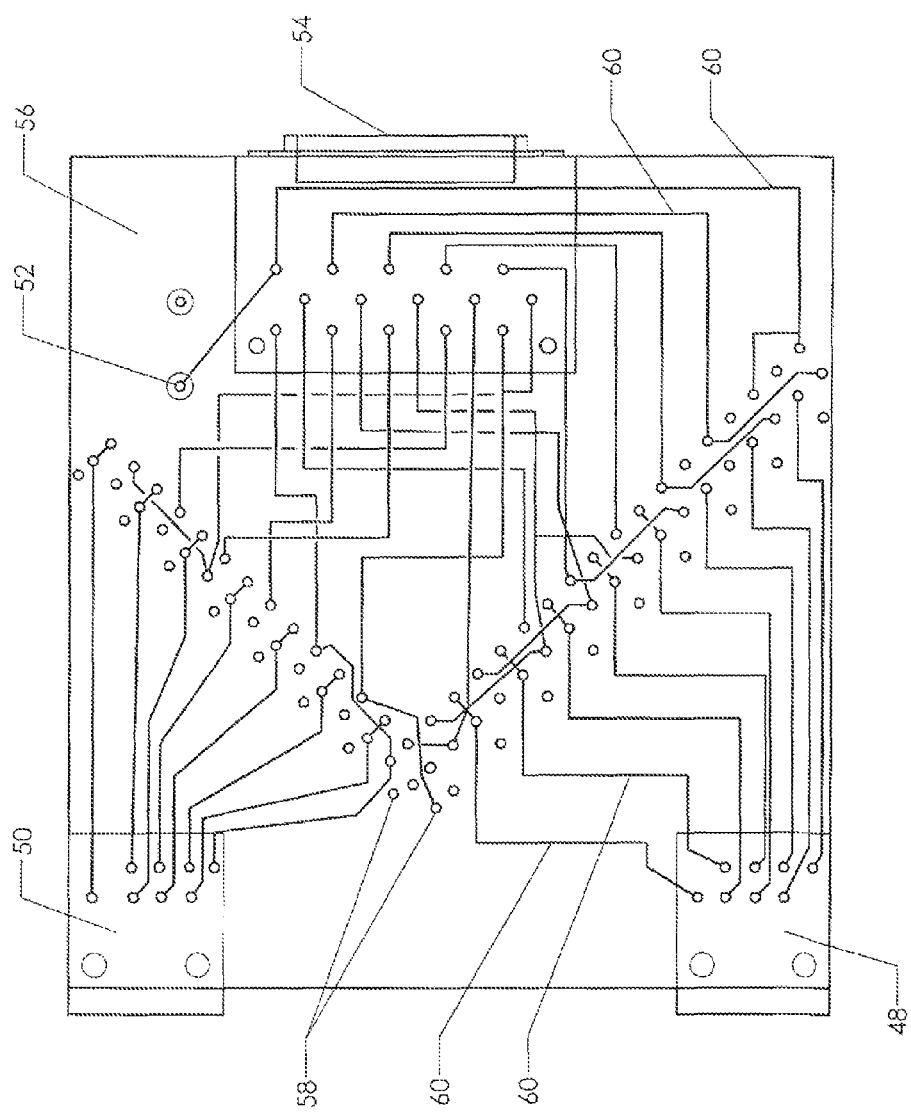
FIG. 6 is a plan view, showing a printed circuit board used in the jumper box.

FIG. 6 is a plan view of the components inside the enclosure of the jumper box. Printed circuit board 56 is used to mount and hold the various jacks. It includes mounting holes, standoffs, or other suitable features to allow it to be attached to the enclosure.

In the embodiment shown, control jack 50 and microphone jack 48 are located on the left edge of the PC board. Each of these jacks has 8 pins connected to the board. A V-shaped array of jumper pins is located in the middle of PC board 56. Those skilled in the art will know that a jumper pin is a conductive pin that protrudes perpendicularly from the plane of the PC board. PCB traces 60 connect the pins of control jack 50 to some of the jumper pins within the jumper pin array.

A "trace" is a conductive path formed as part of the PC board. The board can be two, three, or more layers, and traces in different layers can overlap without shorting. FIG. 6 is not intended to be a completely accurate depiction of the PC board and attached components. Rather, it is more of a schematic view illustrating the conductor paths. Breaks in the conductor paths are shown where one trace crosses another. In reality there are no breaks in these traces. The breaks just indicate that one trace passes over another without the two being electrically connected.

PCB traces connect the 8 pins of microphone jack 48 to some of the jumper pins within the jumper pin array. VGA jack 54 is located on the opposite edge of the PC board in the embodiment shown. It contains 15 pins and a ground, and these are also connected to some of the pins in the jumper pin array.

The purpose of the jumper pin array is to allow the user to selectively connect or combine some of the pins attached to the control and microphone jacks to some of the pins attached to the VGA jack. The reader will observe that the pins in the jumper pin array are evenly spaced and allow jumpers to be placed in a variety of positions.

Figure 7:
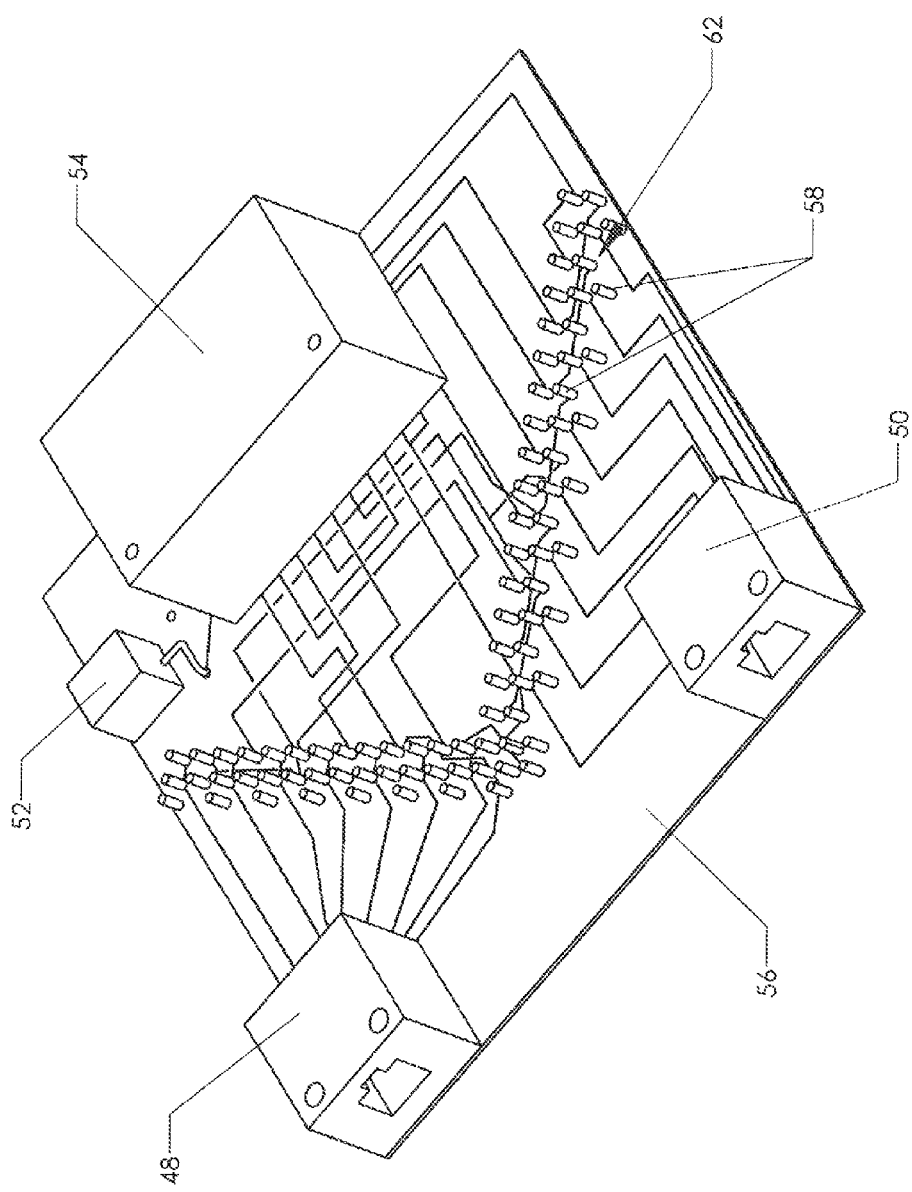
FIG. 7 is a perspective view, showing the jumper pin array on the printed circuit board of FIG. 6.
Figure 8:
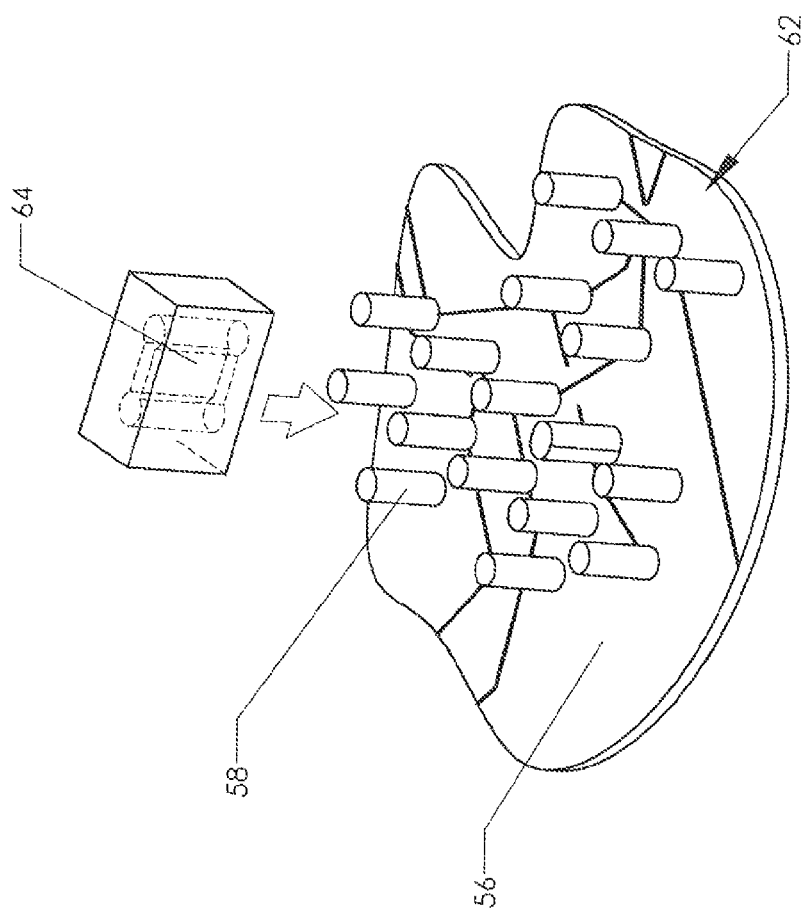
FIG. 8 is a detailed perspective view, showing how a jumper can be used to bridge two of the jumper pins in the jumper pin array.

FIG. 7 shows a perspective view of PC board 56. The reader may more easily perceive the nature of jumper pin array 62 in this view. FIG. 8 shows a detailed view of a portion of the jumper pin array. The juniper pins 58 are evenly spaced so that a jumper 64 placed down over any two pins will electrically connect those pins.

The type of jumper illustrated is one type among the many that will be familiar to those skilled in the art. The jumper has two aligned holes which receive the two jumper pins. The holes include a conductive bridge and the bridge electrically connects the two jumper pins when the jumper is pressed in place. Most such jumpers feature a spring action in the conductive bridge. This feature helps frictionally engage the juniper pins and hold the jumper in position.

Figure 9:
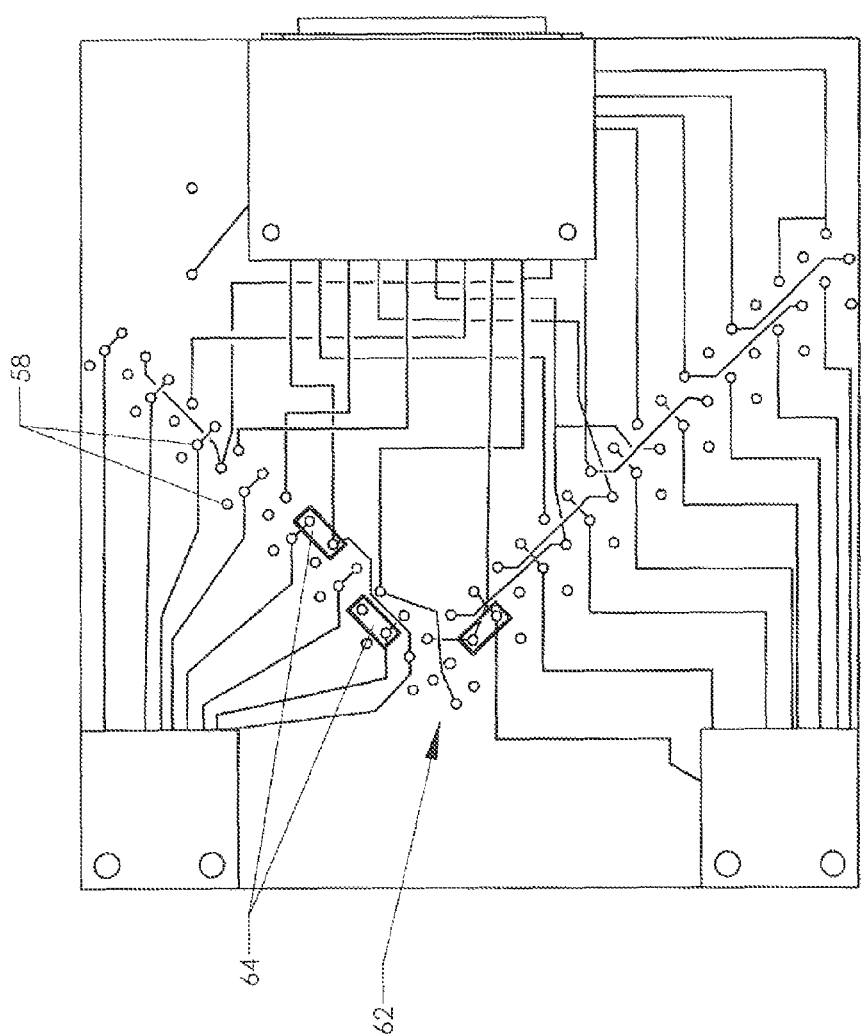
FIG. 9 is a plan view of the printed circuit board, showing one configuration of jumpers.

Turning now to FIG. 9, the reader will observe that three separate jumpers have been placed in jumper pin assembly 62. These connect certain pins of the control jack and microphone jack to the VGA jack. Different jumper configurations will correspond to the RJ45 configuration used by different radio manufacturers. The configuration information is preferably provided to the user. He or she reviews the information and places the jumpers appropriately. The jumper box that is connected to the control head and the microphone has the jumpers placed appropriately to create a conductive path between the pins used by that manufacturer on those RJ45 jacks and the pins on the VGA jack. The information contained on those conductors is therefore sent over the VGA cable connected to the VGA jack.

The other end of the VGA cable is of course connected to the second jumper box. The jumpers within the jumper pin array in the second jumper box are configured to "reverse" the configuration of the first jumper box. In other words, it is configured to take the information from the VGA cable and place it on the appropriate pins of the two RJ45 jacks that will be connected to the radio. Thus, the two jumper boxes and connecting VGA cable are "invisible" to the radio. It behaves as though it were connected directly to the accessories.

Figure 10:
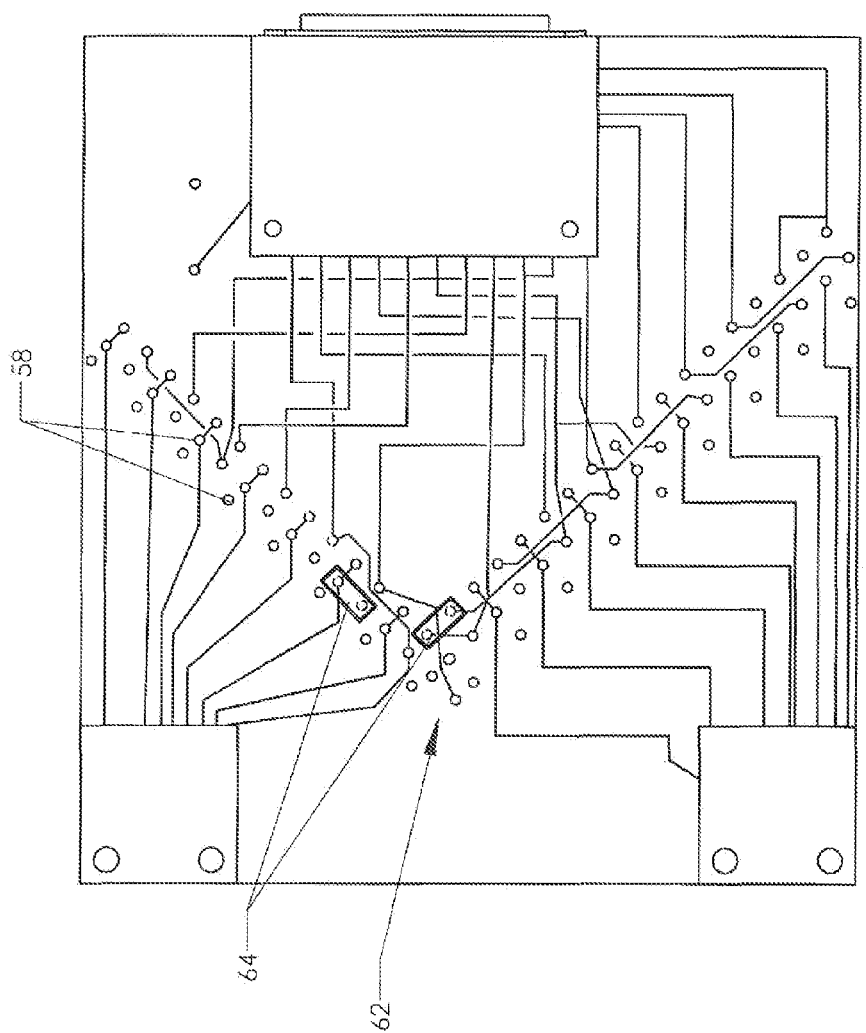
FIG. 10 is a plan view of the printed circuit board, showing a second configuration of jumpers.

FIG. 10 shows a different configuration of jumpers 64 in jumper pin assembly 62. This configuration represents a different type of radio. Many, many more possible configurations are evident by studying the traces and jumper pins in FIG. 6.

It is preferable to carry an audio signal—such as used to drive a speaker—through the VGA cable as well. Returning to FIG. 7, the reader will note the inclusion of audio jack 52. This may be a standard 3.5 mm audio jack. A speaker cable is used to connect a speaker to the audio jack 52 on the jumper box located near the control head. Because the audio jack signal is standardized among most all manufacturers, the audio jack need not be connected through the jumper pin array. Instead, it can just be connected directly to the VGA jack by trace paths within the PC board. The jumper box located next to the radio also has an audio jack.

Thus, an audio cable is connected from the radio to the audio jack on the jumper box in the trunk. The audio signal is then passed through the VGA cable to the jumper box located near the control head. A speaker cable is then used to connect a speaker to the audio jack on that jumper box.

The reader will thereby understand that the proposed invention provides a reconfigurable and inexpensive connection between a radio and remotely located components such as a control head, a microphone, and a speaker. Although the preceding descriptions contain significant detail, they should properly be viewed as disclosing examples of the inventions' many possible embodiments rather than limiting the scope of the invention. For instance, the jumper pin array can assume many different forms and need not be presented in the "V" shape depicted. Many other embodiments are possible, with the scope of the invention properly being defined by the claims rather than any example provided.

Having described my invention, I claim:

1. A method for connecting a control head and a microphone to a radio, comprising:
   a. providing a radio, a control head, and a microphone;
   b. providing a first jumper box, said first jumper box having a control jack, a microphone jack, and a VGA jack;
   c. wherein said first jumper box includes,
      i. a jumper pin array including a plurality of jumper pins;
      ii. wherein some of said plurality of jumper pins are electrically connected to said control jack,
      iii. wherein some of said plurality of jumper pins are electrically connected to said microphone jack,
      iv. wherein some of said plurality of jumper pins are electrically connected to said VGA jack;
   d. providing a second jumper box, said second jumper box having a control jack, a microphone jack, and a VGA jack
   e. wherein said second jumper box includes,
      i. a jumper pin array including a plurality of jumper pins;
      ii. wherein some of said plurality of jumper pins are electrically connected to said control jack,
      iii. wherein some of said plurality of jumper pins are electrically connected to said microphone jack,
      iv. wherein some of said plurality of jumper pins are electrically connected to said VGA jack;
   f. providing a VGA cable;
   g. connecting said first jumper box to said second jumper box by connecting a first end of said VGA cable to said VGA jack on said first jumper box and connecting a second end of said VGA cable to said VGA jack on said second jumper box;
   h. connecting said control head and said microphone to said first jumper box;
   i. connecting said radio to said second jumper box;
   j. providing a plurality of jumpers; and
   k. applying a portion of said plurality of jumpers to said jumper pin array in said first jumper box and a portion of said plurality of jumpers to said jumper pin array in said second jumper box in order to create a desired arrangement of conductor paths between said control head, said microphone, and said radio.

2. A method of connecting a control head and a microphone to a radio as recited in claim 1, further comprising:
   a. providing a speaker, said speaker having an audio connector;
   b. providing an audio jack on said radio;
   c. providing an audio jack on said first jumper box;
   d. providing an audio jack on said second jumper box;
   e. connecting said audio connector on said speaker to said audio jack on said first jumper box;
   f. connecting said audio jack on said second jumper box to said audio jack on said radio; and
   g. wherein said first and second jumper boxes are configured to route a signal existing on said audio jacks through said VGA cable.

3. A method of connecting a control head and a microphone to a radio as recited in claim 1, wherein said control jack and said microphone jack on said first and second jumper boxes are female RJ45 jacks.

4. A method of connecting a control head and a microphone to a radio as recited in claim 1, wherein said jumper pin arrays in said first and second jumper boxes comprise at least two rows of regularly spaced jumper pins, with a distance between adjacent jumper pins being set to allow one of said plurality of jumpers to electrically connect said adjacent jumper pins.

5. A method of connecting a control head and a microphone to a radio as recited in claim 1, wherein said control jack, said microphone jack, said VGA jack, and said jumper pin array in each of said first and second jumper boxes is attached to a printed circuit board.

6. A method of connecting a control head and a microphone to a radio as recited in claim 5, wherein for each of said jumper boxes:
   a. said electrical connections between said control jack and said jumper pin array are provided by said printed circuit board;
   b. said electrical connections between said microphone jack and said jumper pin array are provided by said printed circuit board; and
   c. said electrical connections between said VGA jack and said jumper pin array are provided by said printed circuit board.

7. A method of connecting a control head and a microphone to a radio as recited in claim 2, wherein said control jack and said microphone jack on said first and second jumper boxes are female RJ45 jacks.

8. A method of connecting a control head and a microphone to a radio as recited in claim 4, wherein said control jack and said microphone jack on said first and second jumper boxes are female RJ45 jacks.

9. A method of connecting a control head and a microphone to a radio as recited in claim 5, wherein said control jack and said microphone jack on said first and second jumper boxes are female RJ45 jacks.

10. A method of connecting a control head and a microphone to a radio as recited in claim 6, wherein said jumper pin arrays in said first and second jumper boxes comprise at least two rows of regularly spaced jumper pins, with a distance between adjacent jumper pins being set to allow one of said plurality of jumpers to electrically connect said adjacent jumper pins.

11. A method for connecting a control head and a microphone to a radio, comprising:
   a. providing a radio, a control head, and a microphone;
   b. said radio including a control cable jack and a microphone cable jack;
   c. said control head including a control cable jack;
   d. said microphone including a microphone connector;
   e. providing a first jumper box, said first jumper box having a control jack, a microphone jack, and a VGA jack;
   f. wherein said first jumper box includes,
      i. a jumper pin array including a plurality of jumper pins;
      ii. wherein some of said plurality of jumper pins are electrically connected to said control jack,
      iii. wherein some of said plurality of jumper pins are electrically connected to said microphone jack,
      iv. wherein some of said plurality of jumper pins are electrically connected to said VGA jack;
   g. providing a second jumper box, said second jumper box having a control jack, a microphone jack, and a VGA jack
   h. wherein said second jumper box includes, i. a jumper pin array including a plurality of jumper pins;
ii. wherein some of said plurality of jumper pins are electrically connected to said control jack,
iii. wherein some of said plurality of jumper pins are electrically connected to said microphone jack,
iv. wherein some of said plurality of jumper pins are electrically connected to said VGA jack;
i. providing a VGA cable;
j. connecting said first jumper box to said second jumper box by connecting a first end of said VGA cable to said VGA jack on said first jumper box and connecting a second end of said VGA cable to said VGA jack on said second jumper box;
k. connecting said control head to said first jumper box by connecting said control jack on said control head to said control jack on said first jumper box;
l. connecting said microphone to said first jumper box by connecting said microphone connector to said microphone jack on said first jumper box;
m. connecting said control jack on said radio to said control jack on said second jumper box;
n. connecting said microphone jack on said radio to said microphone jack on said second jumper box;
o. providing a plurality of jumpers; and
p. applying a portion of said plurality of jumpers to said jumper pin array in said first jumper box and a portion of said plurality of jumpers to said jumper pin array in said second jumper box in order to create a desired arrangement of conductor paths between said control head, said microphone, and said radio.

12. A method of connecting a control head and a microphone to a radio as recited in claim 11, further comprising:
a. providing a speaker, said speaker having an audio connector;
b. providing an audio jack on said radio;
c. providing an audio jack on said first jumper box;
d. providing an audio jack on said second jumper box;
e. connecting said audio connector on said speaker to said audio jack on said first jumper box;
f. connecting said audio jack on said second jumper box to said audio jack on said radio; and
g. wherein said first and second jumper boxes are configured to route a signal existing on said audio jacks through said VGA cable.

13. A method of connecting a control head and a microphone to a radio as recited in claim 11, wherein said control jack and said microphone jack on said first and second jumper boxes are female RJ45 jacks.

14. A method of connecting a control head and a microphone to a radio as recited in claim 11, wherein said jumper pin arrays in said first and second jumper boxes comprise at least two rows of regularly spaced jumper pins, with a distance between adjacent jumper pins being set to allow one of said plurality of jumpers to electrically connect said adjacent jumper pins.

15. A method of connecting a control head and a microphone to a radio as recited in claim 11, wherein said control jack, said microphone jack, said VGA jack, and said jumper pin array in each of said first and second jumper boxes is attached to a printed circuit board.

16. A method of connecting a control head and a microphone to a radio as recited in claim 15, wherein for each of said jumper boxes:
a. said electrical connections between said control jack and said jumper pin array are provided by said printed circuit board;
b. said electrical connections between said microphone jack and said jumper pin array are provided by said printed circuit board; and
c. said electrical connections between said VGA jack and said jumper pin array are provided by said printed circuit board.

17. A method of connecting a control head and a microphone to a radio as recited in claim 12, wherein said control jack and said microphone jack on said first and second jumper boxes are female RJ45 jacks.

18. A method of connecting a control head and a microphone to a radio as recited in claim 14, wherein said control jack and said microphone jack on said first and second jumper boxes are female RJ45 jacks.

19. A method of connecting a control head and a microphone to a radio as recited in claim 15, wherein said control jack and said microphone jack on said first and second jumper boxes are female RJ45 jacks.

20. A method of connecting a control head and a microphone to a radio as recited in claim 16, wherein said jumper pin arrays in said first and second jumper boxes comprise at least two rows of regularly spaced jumper pins, with a distance between adjacent jumper pins being set to allow one of said plurality of jumpers to electrically connect said adjacent jumper pins.

* * * * *